US008283707B2

(12) United States Patent
Regolini et al.

(10) Patent No.: US 8,283,707 B2
(45) Date of Patent: Oct. 9, 2012

(54) REDUCTION OF THRESHOLD VOLTAGE INSTABILITIES IN A MOS TRANSISTOR

(75) Inventors: Jorge Regolini, Bernin (FR); Pierre Morin, Grenoble (FR); Daniel Benoit, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 1042 days.

(21) Appl. No.: 11/715,268

(22) Filed: Mar. 6, 2007

(65) Prior Publication Data
US 2007/0215919 A1    Sep. 20, 2007

(30) Foreign Application Priority Data
Mar. 10, 2006 (FR) ...................................... 06 02147

(51) Int. Cl.
*H01L 29/76* (2006.01)
(52) U.S. Cl. ......... 257/288; 257/750; 257/759; 257/760

(58) Field of Classification Search .................. 257/288, 257/750, 759, 760
See application file for complete search history.

(56) References Cited

U.S. PATENT DOCUMENTS

| | | | |
|---|---|---|---|
| 6,268,299 B1 | 7/2001 | Jammy et al. | |
| 2002/0081794 A1 | 6/2002 | Ito | |
| 2003/0036280 A1* | 2/2003 | Jain et al. | 438/700 |
| 2004/0013861 A1 | 1/2004 | Miyanaga et al. | |

OTHER PUBLICATIONS

Preliminary French Search Report, FR 06 02147, dated Nov. 16, 2006.

* cited by examiner

*Primary Examiner* — Long Pham
(74) *Attorney, Agent, or Firm* — Gardere Wynne Sewell LLP

(57) ABSTRACT

A MOS transistor includes an etch stop layer presenting a density of less than a determined threshold value, below which the material of said stop layer is permeable to molecules of dihydrogen and/or water. The material may comprise a nitride. A material used for the etch stop layer preferably has a density value of less than about 2.4 g/cm$^3$.

22 Claims, 3 Drawing Sheets

REDUCTION OF THRESHOLD VOLTAGE INSTABILITIES IN A MOS TRANSISTOR

PRIORITY CLAIM

The present application claims priority from French Patent Application No. 06 02147 filed Mar. 10, 2006, the disclosure of which is hereby incorporated by reference.

BACKGROUND OF THE INVENTION

1. Technical Field of the Invention

The present invention relates to the domain of field-effect transistors, e.g. MOS transistors.

2. Description of Related Art

FIG. 1 represents an example of a known MOS transistor of the prior art.

The transistor 1 comprises a channel 4 separated by two diffusion regions 2, 3, a gate region 13, a spacer 5, as well as contacts 8 corresponding to the drain, source, and gate terminals. The contacts 8 are electrically connected to lines 10, 12 and vias 11.

The contacts are etched into a layer of Pre-Metallization Dielectric (PMD) material 9. When the dimensions of the transistor are relatively small, the etching of the contacts 8 must be controlled with a relatively high precision.

A contact etch stop layer 7 or CESL may be used for this purpose. The layer 7 is relatively rich in nitrogen and is more difficult to etch than the PMD 9. The etching of locations for the contacts 8 is therefore slowed when the layer 7 is reached. It is also possible to detect the end of the etching step by monitoring the amount of oxygen released.

The etch stop layer 7 may be made of silicon nitride ($Si_3N_4$) or silicon oxynitride (SiON). The PMD 9 may be of TEOS (tetraethylorthosilicate glass), BPSG (borophosphosilicate glass), or PSG (phosphosilicate glass).

The etch stop layer 7 also allows applying stress to the rest of the transistor in order to improve its performance.

The transistor 1 also comprises a layer of silicon oxide 6 for insulating the channel 4 from the gate.

The current between the drain and source terminals IDS of a MOS transistor is a function of the voltage $V_{DS}$ between these terminals and a saturation voltage $V_{DSAT}$. The saturation voltage $V_{DSAT}$ is equal to the difference $V_{GS}-V_T$ between the voltage $V_{GS}$ between the gate and the source and a threshold voltage $V_T$.

The behavior of the transistor is therefore highly dependent on the value of the threshold voltage $V_T$.

The value of the threshold voltage $V_T$ depends on various parameters, such as the gate doping, the channel doping, the temperature, the electric field strength, or various characteristics of the oxide layer 6 between the channel and the gate. These characteristics include the thickness of the oxide layer 6, and the number of positive charges accumulated in the oxide layer 6 or in the interface between the oxide layer 6 and the channel 4. These accumulated charges can vary with the temperature and/or electric field strength, creating instabilities in the value of the threshold voltage $V_T$.

There is a need in the art to limit these instabilities in the values of the threshold voltage $V_T$.

SUMMARY OF THE INVENTION

In an embodiment, a MOS transistor comprises an etch stop layer of a density less than a determined threshold value, below which the material of the stop layer is permeable to dihydrogen and/or water molecules.

Surprisingly, one notes that such a transistor presents fewer instabilities in the threshold voltage $V_T$ than prior art transistors in which the etch stop layer presents a relatively high density and is thus impermeable to dihydrogen and/or water molecules.

The phrase "Etch stop layer" is understood to mean a layer which allows detection of the end of etching of the superjacent layer. The etch stop layer is typically created of inorganic dielectric material of a density higher than 1 $g/cm^3$ and preferably able to support relatively high temperatures, for example 400° C.

The etch stop layer may have a different composition than the superjacent layer. For example, the superjacent layer comprises oxygen in non-negligible proportions, unlike the stop layer, such that it is possible to detect the end of etching of the superjacent layer by monitoring the amount of oxygen released.

It is advantageous for the etch stop layer to be a layer more difficult to etch than the superjacent layer, in order to better control the residual thickness etched between the detection of the end of etching and the cessation of the etching.

In the case of a nitride stop layer, meaning one containing nitrogen atoms in non-negligible proportions, particularly between 10 and 80% of the number of atoms, a density of less than about 2.45 $g/cm^3$ and preferably less than about 2.4 $g/cm^3$ allows the passage of dihydrogen and/or water molecules through the stop layer. Of course, other types of stop layers, for example layers of SiC material of sufficient density, may be used.

The material in the etch stop layer of the transistor may for example essentially comprise atoms of silicon, nitrogen, and hydrogen, such that the material of this layer is of the approximated form $Si_xN_yH_z$.

The material of the etch stop layer may in addition comprise oxygen atoms in non-negligible proportions, such that the material of this layer is of the approximated form $Si_xO_wN_yH_z$.

Hydrogen atoms allow obtaining a material of a relatively low density. Alternatively, a low density can be obtained by using materials with a relatively high open porosity, for example porogen materials, to create an etch stop layer.

The trainvention is particularly advantageous when the MOS transistor is PMOS. The instabilities in the values of the threshold voltage $V_T$ are in fact greater in PMOS than in NMOS transistors. However, when the MOS transistor is NMOS, the permeability of the etch stop layer decreases the instabilities here as well.

In another embodiment, a semiconductor device comprises at least one transistor in accordance with the foregoing description. By decreasing the instabilities in the values of the threshold voltages $V_T$ of the MOS transistors of the device, the invention improves the general operation of the device.

In another embodiment, a process for manufacturing a MOS transistor comprises depositing an etch stop layer of a density lower than a determined threshold value, below which the material in the stop layer is permeable to dihydrogen and/or water molecules.

It is advantageous for this deposition to occur using plasma, thus allowing control of the composition of the material in the stop layer at relatively low temperatures, for example temperatures of less than 500° C. This avoids deterioration of the rest of the transistor due to exposure to relatively high temperatures.

The process is of course not limited to the use of plasma. In one variation, low-temperature precursors can for example be used, as well as other deposition techniques such as ALD (Atomic Layer Deposition).

In an embodiment, a MOS transistor comprises a gate, a source region and a drain region; and an etch stop layer overlying the gate, source region and drain region wherein that etch stop layer is permeable to both dihydrogen and water molecules.

In another embodiment, a process for manufacturing a MOS transistor comprises forming a gate, a source region and a drain region; and depositing an etch stop layer overlying the gate, source region and drain region wherein that etch stop layer is permeable to both dihydrogen and water molecules.

BRIEF DESCRIPTION OF THE DRAWINGS

Other characteristics and advantages will become apparent through the description of the embodiments given below, with references to the figures wherein.

DETAILED DESCRIPTION OF THE DRAWINGS

In the figures, identical reference numbers are used to designate like or similar objects.

Permeability and Density

Figure 1:
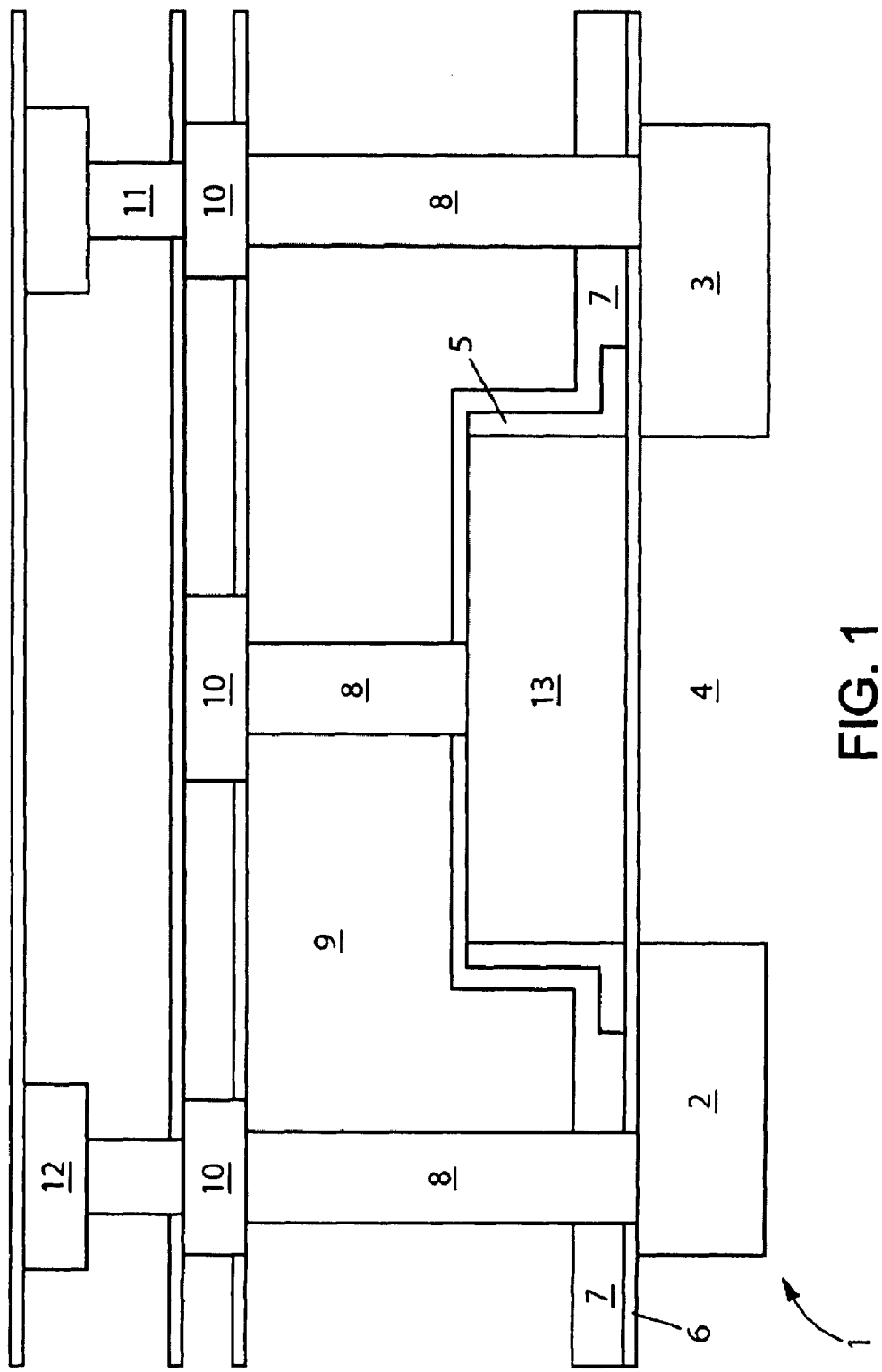
FIG. 1, already explained, shows an example of a known prior art transistor.
Figure 2:
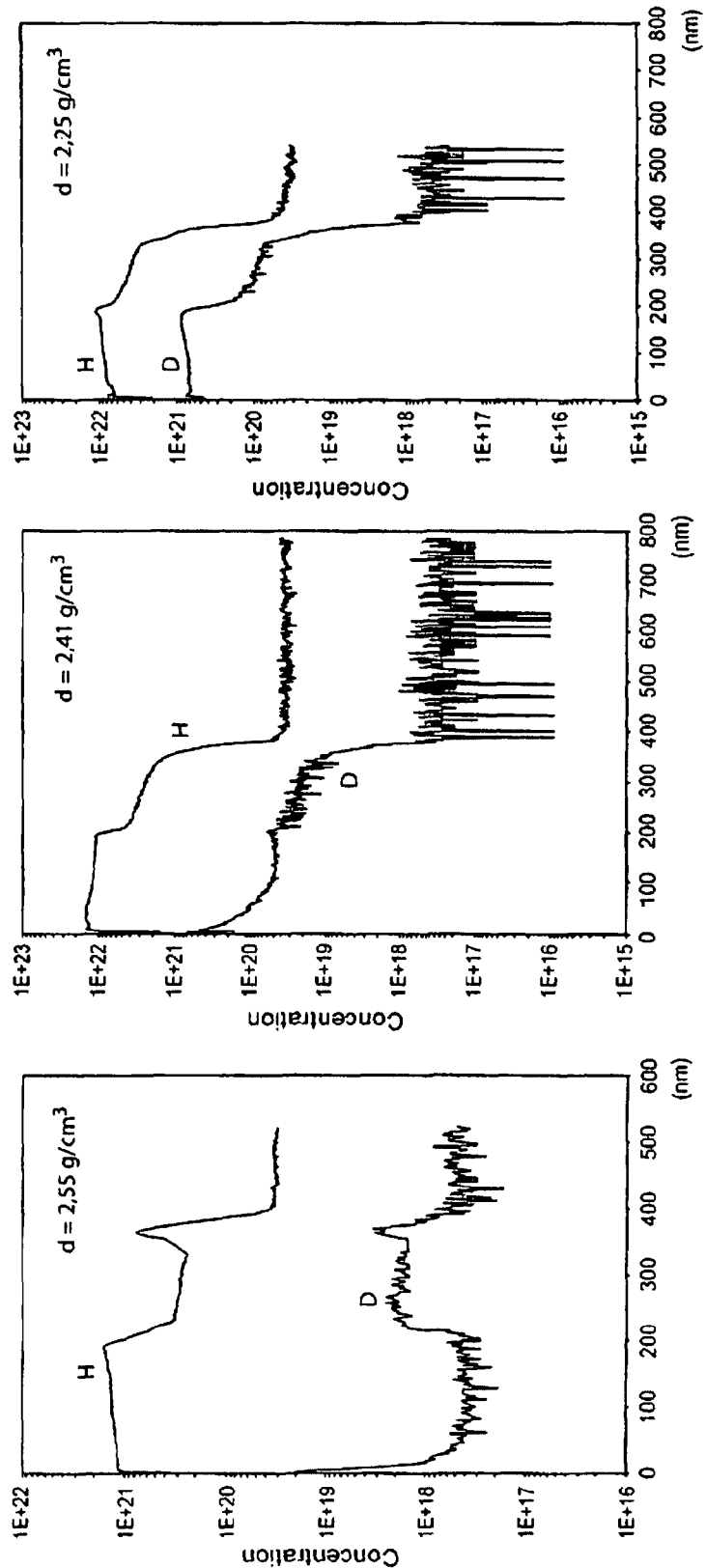
FIGS. 2A, 2B and 2C are diffusion profiles for deuterium obtained by SIMS (Secondary Ion Mass Spectrometry) on different samples of silicon-oxide-nitride stacks.

FIGS. 2A, 2B and 2C show variations in the concentrations of hydrogen and deuterium atoms as atoms per cm$^3$, with the depth in nanometers, for samples of silicon-oxide-nitride stacks which have been subjected to an annealing step in a deuterium atmosphere.

To create these stacks, a layer of oxide was deposited on a layer of silicon. A nitride layer approximately 200 nm thick was then deposited on the oxide layer. These stacks can be used in MOS transistors, with the nitride layer serving as the etch stop layer.

In FIG. 2A, the material chosen for the stop layer has a density of 2.55 g/cm$^3$.

In FIGS. 2B and 2C, the stop layers have respective densities of 2.41 g/cm$^3$ and 2.25 g/cm$^3$.

The ratio of the concentrations of deuterium and hydrogen atoms at 0 to 200 nm, meaning at depths corresponding to the nitride layer, allows conclusions to be drawn concerning the permeability of this nitride layer.

For example, in FIG. 2A, the ratio of the concentrations of deuterium to hydrogen atoms is roughly 1 to 1000, which is roughly the isotopic ratio. The stop layer is therefore impermeable to the deuterium atoms in the oxide layer.

However, at a density of 2.41 g/cm$^3$ as shown in FIG. 2B, this ratio is roughly 1 to 100. Deuterium atoms in the oxide layer are therefore penetrating the stop layer.

This ratio increases to approximately 1 to 10 at a density of 2.25 g/cm$^3$, and the graph of the deuterium atom concentration is more or less flat at the depths corresponding to the stop layer. Not only are deuterium atoms in the oxide layer penetrating the stop layer, the latter layer is saturated with deuterium atoms. Therefore the deuterium atoms probably cross the stop layer and thus avoid confinement within the rest of the transistor.

Thus it is possible to obtain stop layers permeable to hydrogen atoms by producing a stop layer of relatively low density.

Figure 3:
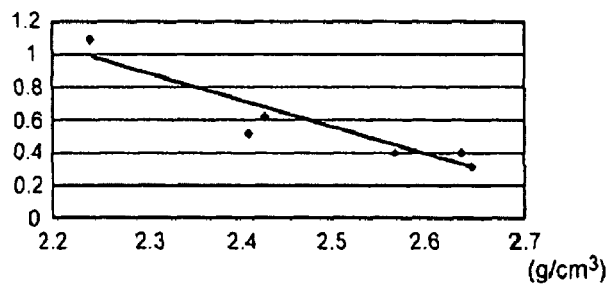
FIG. 3 is an experimental graph showing variations in the permeability as a function of the density of the etch stop layer.

FIG. 3 shows the relationship between permeability and density more explicitly. In this graph are represented several measurements of the integrated deuterium content on an arbitrary scale, as a function of the density in g/cm$^3$. The deuterium concentration, and therefore the permeability, increase as the density decreases.

Density and Instabilities

Figure 4:
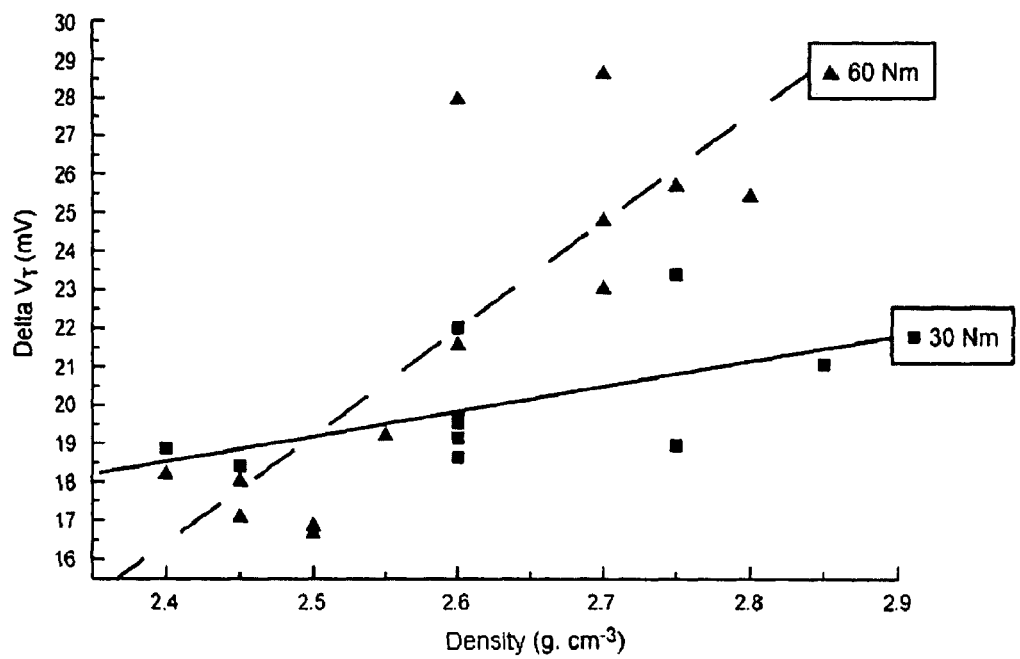
FIG. 4 is an experimental graph showing variations in the observed difference in threshold voltage as a function of the density of the etch stop layer.

FIG. 4 is an experimental graph showing the variations in the observed difference in threshold voltage as a function of the density in the etch stop layer, for stop layer thicknesses of 30 nm and 60 nm.

An increase in the observed difference in threshold voltage, or in other words the instability, is generally observed as the density increases. For example, for a stop layer thickness of 60 nm and a density of 2.8 g/cm$^3$, the latter a common density for known transistor stop layers, the difference in threshold voltage is about 25.5 mV. This difference falls to about 18 mV for a density of 2.4 g/cm$^3$.

Example of a Production Process

Figure 5:
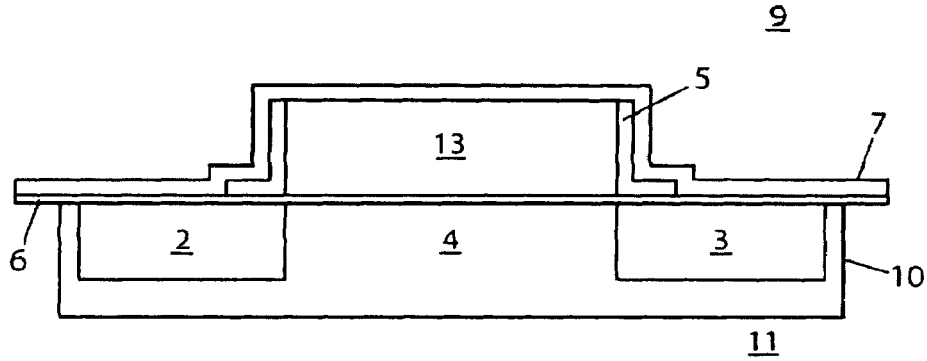
FIG. 5 shows an example of a MOS transistor in one embodiment.

FIG. 5 shows an example of a PMOS transistor according to one embodiment. Onto an active part which groups a substrate 11, a casing (or well) N 10, a channel 4, two diffusion zones 2, 3, a gate zone 13, a spacer 5, and an oxide layer 6, is deposited a stop layer 7 and a PMD 9. The material in the stop layer has a density of less than a determined value, below which the material is permeable to dihydrogen and water molecules.

In this example, the stop layer 7 is deposited using plasma, at a pressure of about 733 Pa (5.5 Torr) and a temperature of 480° C. Silane (SiH$_4$) is introduced at a flow rate of about 8×10$^{-6}$ m$^3$/s (which is 480 cm$^3$/min), and ammonia (NH$_3$) is introduced at a flow rate of about 2.67×10$^{-6}$ m$^3$/s (which is about 160 cm$^3$/min). A radiofrequency power of about 600 W is applied in order to create a plasma.

For the time which results in a thickness of the stop layer of 300 nm, the refraction index obtained is 2.17 to 633 nm. Of the number of bonds, the percentage of bonds between a silicon atom and a hydrogen atom is about 22%. The bonds between a nitrogen atom and a hydrogen atom represent 2% of the number of bonds. The stop layer has a density of 2.25 g/cm$^3$, and applies a stress of 176×10$^6$ N/m$^2$ to the rest of the transistor.

The transistor may also comprise contacts, lines and vias (not represented in FIG. 5).

The invention is of course not limited to this example. Other production processes may be used, and in particular other conditions. However, a nitride stop layer is preferred which applies stress of −400×10$^6$ N/m$^2$ to +400×10$^6$ N/m$^2$ on the rest of the transistor and which has a density of less than 2.45 g/cm$^3$.

In particular the density can be less than 2.3 g/cm$^3$. For example, a density of 2.2 g/cm$^3$ obtains particularly satisfactory results.

It is possible to think that these results are due to an evacuation of dihydrogen molecules via the permeable layer. In fact, instabilities in the value of the threshold voltage could be due to an accumulation of positive charges in the oxide layer 6. These positive charges could be created by positively charged hydrogen atoms, originating for example from "hydrogen-donor" complexes in the depletion zone. Due to the electric field strength, a positively charged hydrogen atom would move towards the interface with the oxide layer 6 and could strip a hydrogen atom from the oxide layer 6 in the reaction:

$$\text{Si—H} + \text{H}^+ \rightarrow \text{D}^+ + \text{H}_2, \quad (1)$$

where D indicates a dangling bond.

The positively charged hydrogen atom could also penetrate into the oxide layer 6.

In the first case, the formed molecule of gaseous dihydrogen could be evacuated via the permeable stop layer.

The surprising effect obtained with permeable stop layers leads to the belief that in prior art transistors, the stop layer confines the dihydrogen molecule to the interior of the transistor. This dihydrogen molecule could dissociate into two positively charged hydrogen atoms. These two hydrogen atoms would in turn move towards the oxide layer 6, and could each strip a hydrogen atom from the oxide layer 6 by the reaction (1). Such chain reactions would result in a relatively high number of positive charges in the interface between the channel and the oxide layer. Such an accumulation of positive charges would result in instabilities in the value of the threshold voltage.

The present invention would allow at least part of the dihydrogen molecules to evacuate, and would therefore limit such chain reactions. It would also limit the number of positively charged hydrogen atoms. As a result, the number of hydrogen atoms penetrating into the oxide layer would also be limited. The present invention would thus limit the number of positive charges created at the interface between the channel and the oxide layer.

The charges in the oxide layer 6 could also be due to negatively charged —OH⁻ groups or —OH radicals. These —OH groups or radicals would strip a hydrogen atom from the oxide layer in a reaction such as $$\text{Si—H} + \text{OH}^- \rightarrow \text{D}^{-+} + \text{H}_2\text{O}, \quad (2)$$

where D represents a dangling bond.

In a prior art transistor, the formed molecule of water would remain confined within the transistor and could dissociate, with the risk of chain reactions.

A water-permeable stop layer would allow at least partial evacuation of the water molecules formed by the reaction (2), and would therefore limit the chain reactions.

In addition, these —OH groups or radicals could also penetrate into the oxide layer 6. By limiting the number of water molecules inside the transistor, the present invention also limits the risk of penetration of these —OH groups or radicals into the oxide layer.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A MOS transistor comprising an etch stop layer formed of a $Si_xN_yH_z$ material presenting a density value of less than a threshold value, wherein the threshold value is below a density value for which the material of said etch stop layer is permeable to dihydrogen and/or water molecules.

2. The MOS transistor according to claim 1, wherein the etch stop layer comprises nitrogen atoms in non-negligible proportions, and the threshold value is equal to about 2.45 g/cm³.

3. The MOS transistor according to claim 2, wherein the etch stop layer has a density value of less than about 2.4 g/cm³.

4. The MOS transistor according to claim 1, wherein the MOS transistor is a PMOS transistor.

5. A semiconductor device comprising at least one MOS transistor wherein the MOS transistor has an etch stop layer formed of a $Si_xN_yH_z$ material presenting a density value of less than a threshold value, wherein the threshold value is below a density value for which the material of said etch stop layer is permeable to dihydrogen and/or water molecules.

6. The device according to claim 5, wherein the etch stop layer comprises nitrogen atoms in non-negligible proportions, and the threshold value is equal to about 2.45 g/cm³.

7. The device according to claim 6, wherein the etch stop layer has a density value of less than about 2.4 g/cm³.

8. The device according to claim 5, wherein the MOS transistor is a PMOS transistor.

9. A MOS transistor, comprising:
a gate, a source region and a drain region; and
an etch stop layer overlying the gate, source region and drain region wherein that etch stop layer is formed of a $Si_xN_yH_z$ material permeable to both dihydrogen and water molecules.

10. The MOS transistor of claim 9, wherein a material used for the etch stop layer has a density value of less than about 2.4 g/cm³.

11. The MOS transistor of claim 10 wherein the material used for the etch stop layer is a nitride.

12. The MOS transistor of claim 10 wherein the material used for the etch stop layer is made from silane and ammonia.

13. A MOS transistor comprising an etch stop layer formed of a $Si_xN_yH_z$ material presenting a density value of between about 2.2 g/cm³ and about 2.65 g/cm³, and wherein the $Si_xN_yH_z$ material of said etch stop layer is permeable to dihydrogen and/or water molecules.

14. The MOS transistor of claim 13 wherein the nitrogen content of the $Si_xN_yH_z$ material is between 25% and 80%.

15. The MOS transistor of claim 13 wherein the nitrogen content of the $Si_xN_yH_z$ material is between 50% and 70%.

16. The MOS transistor of claim 15, wherein the $Si_xN_yH_z$ material etch stop layer has a density value of less than about 2.4 g/cm³.

17. The MOS transistor of claim 15, wherein transistors including the $Si_xN_yH_z$ material etch stop exhibit a difference in threshold voltage of less than about 24 mV.

18. The MOS transistor of claim 15, wherein transistors including the $Si_xN_yH_z$ material etch stop exhibit a difference in threshold voltage of less than about 19 mV.

19. A MOS transistor comprising an etch stop layer formed of a porogen material presenting a density value of between about 2.2 g/cm³ and about 2.65 g/cm³, and wherein the porogen material of said etch stop layer is permeable to dihydrogen and/or water molecules.

20. The MOS transistor of claim 19, wherein the porogen material etch stop layer has a density value of less than about 2.4 g/cm³.

21. The MOS transistor of claim 19, wherein transistors including the porogen material etch stop exhibit a difference in threshold voltage of less than about 24 mV.

22. The MOS transistor of claim 19, wherein transistors including the porogen material etch stop exhibit a difference in threshold voltage of less than about 19 mV.

* * * * *